(12) United States Patent
Haran et al.

(10) Patent No.: US 10,566,328 B2
(45) Date of Patent: Feb. 18, 2020

(54) INTEGRATED CIRCUIT PRODUCTS WITH GATE STRUCTURES POSITIONED ABOVE ELEVATED ISOLATION STRUCTURES

(71) Applicant: GLOBALFOUNDRIES Inc., Grand Cayman (KY)

(72) Inventors: Bala Haran, Watervliet, NY (US); Christopher Sheraw, Ballston Spa, NY (US); Mahender Kumar, San Jose, CA (US)

(73) Assignee: GLOBALFOUNDRIES Inc., Grand Cayman (KY)

(*) Notice: Subject to any disclaimer, the term of this patent is extended or adjusted under 35 U.S.C. 154(b) by 0 days.

(21) Appl. No.: 15/904,555

(22) Filed: Feb. 26, 2018

(65) Prior Publication Data

US 2019/0267371 A1  Aug. 29, 2019

(51) Int. Cl.
| | | |
|---|---|---|
| *H01L 27/02* | (2006.01) | |
| *H01L 27/088* | (2006.01) | |
| *H01L 29/06* | (2006.01) | |
| *H01L 21/8234* | (2006.01) | |
| *H01L 21/762* | (2006.01) | |
| *H01L 29/66* | (2006.01) | |
| *H01L 29/423* | (2006.01) | |
| *H01L 21/3105* | (2006.01) | |
| *H01L 21/311* | (2006.01) | |

(52) U.S. Cl.
CPC .... *H01L 27/0886* (2013.01); *H01L 21/76224* (2013.01); *H01L 21/823431* (2013.01); *H01L 21/823437* (2013.01); *H01L 21/823481* (2013.01); *H01L 27/0207* (2013.01); *H01L 29/0649* (2013.01); *H01L 29/4238* (2013.01); *H01L 29/42376* (2013.01); *H01L 29/66545* (2013.01); *H01L 21/31053* (2013.01); *H01L 21/31111* (2013.01); *H01L 21/31144* (2013.01)

(58) Field of Classification Search
None
See application file for complete search history.

(56) References Cited

U.S. PATENT DOCUMENTS

| | | | | |
|---|---|---|---|---|
| 8,551,843 | B1* | 10/2013 | Cai | H01L 21/28123 257/E21.19 |
| 2014/0117454 | A1* | 5/2014 | Liu | H01L 29/6681 257/368 |
| 2015/0162247 | A1* | 6/2015 | Choi | H01L 27/0886 257/401 |
| 2015/0311081 | A1* | 10/2015 | Xie | H01L 21/28008 257/411 |
| 2016/0293756 | A1* | 10/2016 | Liu | H01L 29/7827 |
| 2017/0053966 | A1* | 2/2017 | Lam | H01L 27/2436 |

* cited by examiner

*Primary Examiner* — Bilkis Jahan
(74) *Attorney, Agent, or Firm* — Amerson Law Firm, PLLC

(57) ABSTRACT

One illustrative integrated circuit product disclosed herein includes a plurality of FinFET transistor devices, a plurality of fins, each of the fins having an upper surface, and an elevated isolation structure having an upper surface that is positioned at a level that is above a level of the upper surface of the fins. In this example, the product also includes a first gate structure having an axial length in a direction corresponding to the gate width direction of the transistor devices, wherein at least a portion of the axial length of the first gate structure is positioned above the upper surface of the elevated isolation structure.

17 Claims, 26 Drawing Sheets

US 10,566,328 B2

INTEGRATED CIRCUIT PRODUCTS WITH GATE STRUCTURES POSITIONED ABOVE ELEVATED ISOLATION STRUCTURES

BACKGROUND OF THE INVENTION

1. Field of the Invention

The present disclosure generally relates to the fabrication of integrated circuits, and, more particularly, to various methods of forming gate structures above elevated isolation structures and integrated circuit products having such elevated isolation structures.

2. Description of the Related Art

Field Effect Transistors ("FETs") come in a variety of shapes and forms, e.g., planar transistors, FinFET transistors, vertical transistors, nanowire devices, etc. There are so-called 3D devices, such as an illustrative FinFET device, which is a three-dimensional structure. In general, a FinFET semiconductor device includes one or more vertically oriented fins having a three-dimensional configuration: a vertical height, a lateral width and an axial length. Such a device also includes a gate structure that wraps the two sidewalls and the upper surface of the fin(s) at a location along the axial length of the fin(s). The axial length of the fin(s) corresponds to the gate length of the device, i.e., the direction of current transport in the device 10 when it is operational. The portion of the fin(s) covered by the gate structure is the channel region of the FinFET device.

For many FET devices, the gate structures are initially formed as continuous line-type structures that extend across the entire substrate, including across both active regions and isolation regions. The gate structures for such devices may be manufactured using well-known gate-first or replacement gate (or "gate-last") manufacturing techniques. The gate structures (final gate structures in a gate-last process or sacrificial gate structures in a replacement gate process) are initially formed as continuous line-type structures that extend across the entire substrate, including across both active regions and isolation regions. As device scaling continues, the vertical height of the gate structures has increased, while the lateral width (i.e., gate length or critical dimension) of the gate structures has decreased. As a result, the aspect ratio (height/lateral width) of the gate structures has increased. In some cases, due to this increased aspect ratio, at least a portion of the axial length of the gate structure may actually tilt or "flip-over," from their desired substantially vertical orientation. For example, portions of a gate structure that are not positioned above one or more of fins, i.e., portions of a gate structure positioned above a device isolation region formed in the substrate, may be susceptible to such tilting. Such tilting of the gate structures, if sufficient, may lead to significant degradation of the performance of the IC product.

The present disclosure is directed to various methods of forming gate structures above elevated isolation structures and integrated circuit products having such elevated isolation structures that may eliminate or at least reduce one or more of the problems identified above.

SUMMARY OF DISCLOSED EMBODIMENTS

The following presents a simplified summary of the disclosed embodiment in order to provide a basic understanding of some aspects of the subject matter disclosed herein. This summary is not an exhaustive overview of all of the subject matter disclosed herein. It is not intended to identify key or critical elements of the subject matter disclosed herein or to delineate the scope of any claims directed to any of the subject matter disclosed herein. Its sole purpose is to present some concepts in a simplified form as a prelude to the more detailed description that is discussed later in the application.

Generally, the present disclosure is directed to various methods of forming gate structures above elevated isolation structures and integrated circuit products that include such elevated isolation structures. One illustrative integrated circuit product disclosed herein includes a plurality of FinFET transistor devices, a plurality of fins, each of the fins having an upper surface, and an elevated isolation structure having an upper surface that is positioned at a level that is above a level of the upper surface of the fins. In this example, the product also includes a first gate structure having an axial length in a direction corresponding to the gate width direction of the transistor devices, wherein at least a portion of the axial length of the first gate structure is positioned above the upper surface of the elevated isolation structure.

One illustrative method disclosed herein includes forming a plurality of fins in a semiconductor substrate, each of the fins having an upper surface, forming a recessed isolation structure in a trench formed in the semiconductor substrate and forming a layer of sacrificial gate electrode material above the fins and the recessed isolation structure. In this example, the method also includes removing a portion of the layer of sacrificial gate electrode material from above at least a portion of the recessed isolation structure to form an opening in at least the layer of sacrificial gate electrode material, forming an elevated isolation structure in the opening and above the recessed isolation structure, wherein the elevated isolation structure has an upper surface that is positioned at a level that is above a level of the upper surface of the fins and below a level of an upper surface of the layer of sacrificial gate electrode material, and forming additional sacrificial gate electrode material in the opening above the elevated isolation structure.

BRIEF DESCRIPTION OF THE DRAWINGS

The disclosure may be understood by reference to the following description taken in conjunction with the accompanying drawings, in which like reference numerals identify like elements, and in which.

Figure 1:
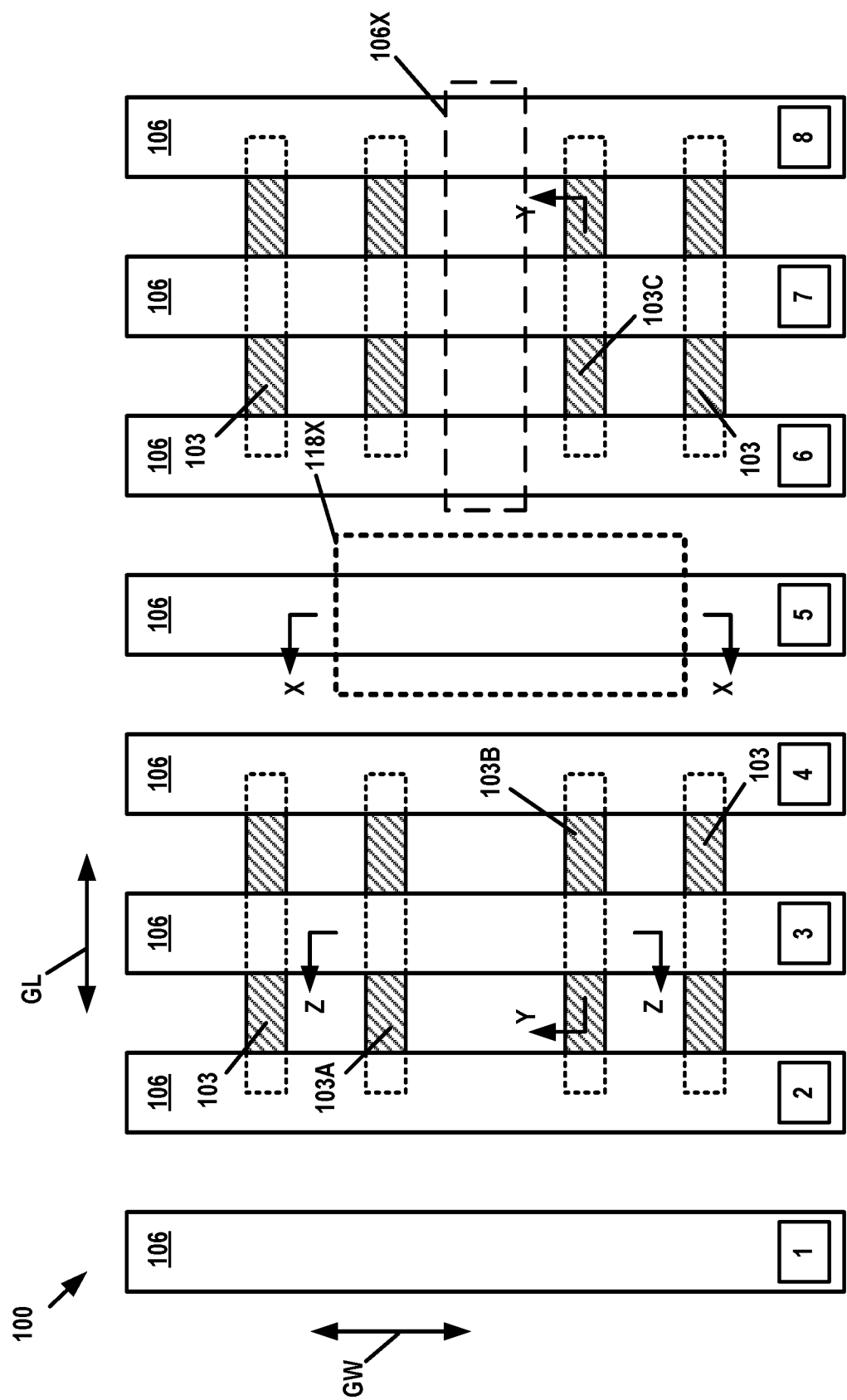
FIGS. 1-27 depict various methods of forming gate structures above elevated isolation structures and integrated circuit products having such elevated isolation structures.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming gate structures above elevated isolation structures and integrated circuit products having such elevated isolation structures. As will be readily apparent to those skilled in the art upon a complete reading of the present application, the presently disclosed methods may be employed when forming transistor devices having a variety of different configurations, e.g., vertical transistor devices, FinFET devices, etc. The illustrative examples described and depicted herein involve use of the methods disclosed herein to form an integrated circuit (IC) product 100 comprised of illustrative FinFET devices. However, the presently disclosed inventions should not be considered to be limited to any particular type or form of transistor device. Moreover, the methods and devices disclosed herein may be employed when forming a variety of products, including, but not limited to, logic products, memory products, etc. With reference to the attached figures, various illustrative embodiments of the methods and devices disclosed herein will now be described in more detail.

Figure 2:
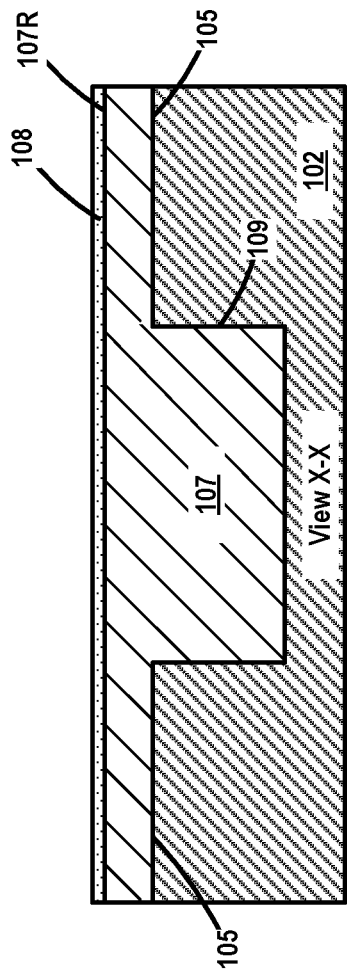

FIG. 1 is a simplistic plan view of an IC product 100 that is formed in and above a semiconductor substrate 102 (see FIG. 2). As shown in FIG. 1, a plurality of fins 103 has been formed in the substrate 102. The fins 103 may be formed using well-known "fin-cut-first" or "fin-cut-last" manufacturing techniques. Three of the fins 103 have been identified with reference numbers 103A, 103B and 103C for ease of reference. Each of the devices may comprise any number of fins 103. Also depicted in FIG. 1 are simplistically depicted final gate structures 106 for various FinFET transistor devices. The gate length (GL) direction and the gate width (GW) direction of the transistor devices are depicted in FIG. 1. The gate structures 106 are number 1-8 for ease of reference. The gate structures 1 and 5 are formed above isolation material (not shown in FIG. 1) that is formed in the substrate 102 to separate and electrically isolate the various transistor devices from one another. That is, in at least this region of the IC product, the gate structures 1 and 5 are not positioned above any fins 103. In the example shown in FIG. 1, the gate structures 106 are depicted as being substantially continuous line-type structures. In a real-world device, one or more of the gate structures 106 may be "cut", as indicated by the dashed-lines 106X, so as to form individual gate structures 106 that have different axial lengths. Also depicted in FIG. 1 (in dashed lines) is the location wherein an illustrative elevated isolation structure 118X will be formed on the product 100 under gate structure 5.

Also depicted in FIG. 1 are the locations where various cross-sectional views "X-X", "Y-Y" and "Z-Z" shown in subsequent drawings are taken. More specifically, the view X-X is a cross-sectional view taken in the gate width direction of the devices along the axial length of gate structure 5. The view Y-Y is a cross-sectional view taken in the gate length direction of the devices through the centerline of the fins 103B and 103C and across gate structures 3-7. The view Z-Z is a cross-sectional view taken in the gate width direction of the devices along the axial length of gate structure 3 and across the fins 103A and 103B.

The substrate 102 may have a variety of configurations, such as the bulk substrate configuration depicted herein or a semiconductor-on-insulator (SOI) configuration. Such an SOI substrate includes a bulk semiconductor layer, a buried insulation layer positioned on the bulk semiconductor layer and an active semiconductor layer positioned on the buried insulation layer, wherein the transistor devices disclosed herein are formed in and above the active layer. The active layer and/or the bulk semiconductor layer may be made of silicon or they may be made of semiconductor materials other than silicon, and they both do not have to be made of the same semiconductor material. Thus, the terms "substrate" or "semiconductor substrate" should be understood to cover all semiconducting materials and all forms of such materials. It should be noted that the final gate structure for the transistor devices disclosed herein may be formed by performing well-known replacement gate manufacturing techniques. Additionally, various doped regions, e.g., halo implant regions, doped source/drain regions, well regions and the like, are not depicted in the attached drawings. The transistor devices depicted herein may be either NMOS or PMOS transistors. The various components and structures of the transistor devices disclosed herein may be formed using a variety of different materials and by performing a variety of known techniques, e.g., a chemical vapor deposition (CVD) process, an atomic layer deposition (ALD) process, a thermal growth process, spin-coating techniques, epi growth processes, etc. The thicknesses of these various layers of material may also vary depending upon the particular application.

Figure 3:
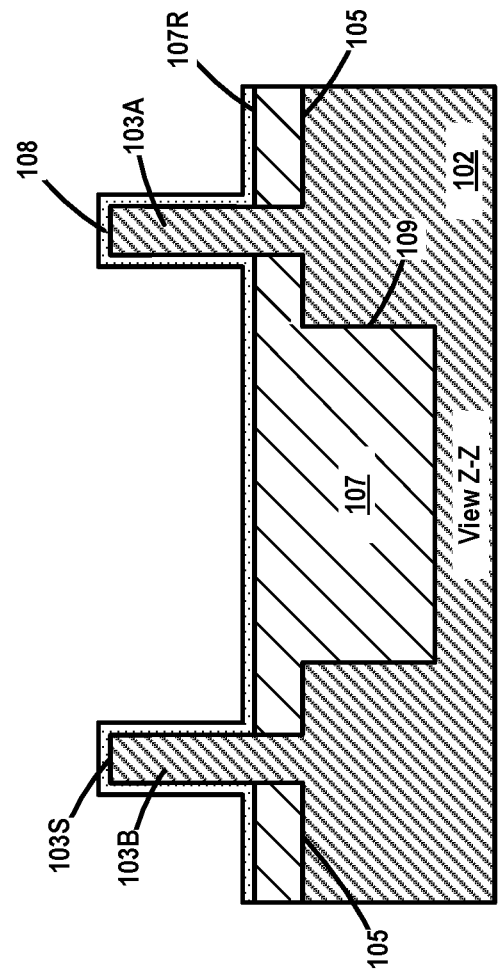
Figure 4:
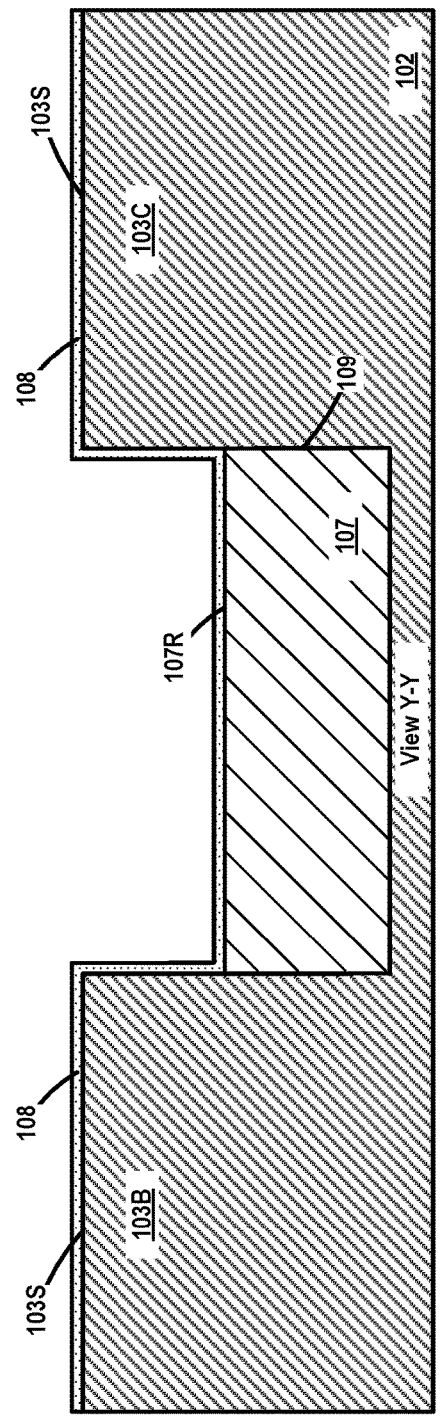

FIG. 2 (view X-X), FIG. 3 (view Z-Z) and FIG. 4 (view Y-Y) depict the IC product 100 after several process operations were performed. First, the fins 103 were formed in the substrate 102. In one illustrative example, the fins 103 were formed by performing one or more etching processes, e.g., anisotropic etching processes, through a patterned fin-formation etch mask (not shown) to form a plurality of fin-formation trenches 105 in the substrate 102 and thereby define or form the plurality of fins 103. The lateral width and vertical height of the fins 103 may vary depending upon the particular application. Additionally, the overall size, shape and configuration of the fin-formation trenches 105 and the fins 103 may vary depending on the particular application. In the illustrative examples depicted in the attached drawings, the fin-formation trenches 105 and the fins 103 are all depicted as having a uniform size and shape. However, such uniformity in the size and shape of the trenches 105 and the fins 103 is not required to practice at least some aspects of the inventions disclosed herein. In the attached figures, the fin-formation trenches 105 are depicted as having been formed by performing an anisotropic etching process that results in the fins 103 having a schematically (and simplistically) depicted, generally rectangular configuration. In an actual real-world device, the sidewalls of the fins 103 may be somewhat outwardly tapered (i.e., the fins may be wider at the bottom of the fin than they are at the top of the fin) although that configuration is not depicted in the attached drawings. Thus, the size and configuration of the fin-formation trenches 105 and the fins 103, and the manner in which they are made, should not be considered a limitation of the presently disclosed inventions. For ease of disclosure, only the substantially rectangular trenches 105 and fins 103 will be depicted in the subsequent drawings.

With continuing reference to FIGS. 2-4, in one illustrative process flow, after the fins 103 were formed, another patterned etch mask (not shown) was formed above the substrate 102. This patterned etch mask has a plurality of openings that correspond to locations where device isolation structures will be formed in the substrate 102 to electrically isolate various transistor devices (or groups of devices) from one another. Thereafter, one or more etching processes were performed thorough the patterned etch mask to form device isolation trenches 109 in the substrate 102. Next, a layer of insulating material 107, such as silicon dioxide, was deposited so as to over-fill the fin-formation trenches 105 and device isolation trenches 109 such that insulating material 107 was positioned above the upper surface of the patterned etch mask that was used to pattern the fins 103. Thereafter, a CMP process was performed to planarize the upper surface of the deposited layer of insulating material 107 with the upper surface of the patterned etch mask that was used to pattern the fins 103. Then, a recess etching process was performed to recess the layer of insulating material 107 such that it has a recessed upper surface 107R that exposes a desired portion or amount of the vertical height of the fins 103 (see FIG. 3). The amount of recessing of the layer of insulating material 107 may vary depending upon the particular application. Then, one or more etching processes were performed to remove the patterned etch mask that was used to pattern the fins 103 relative to the surrounding materials. Finally, a conformal deposition process was performed to form a conformal sacrificial gate insulation layer 108, e.g., silicon dioxide, on the product 100. In some applications, an oxidation process may be performed to form the sacrificial gate insulation layer 108 on just the exposed portions of the fins 103.

As noted above, the final gate structures 106 for the transistor devices will be manufactured using a replacement gate manufacturing process disclosed herein. However, the presently disclosed inventions should not be considered to be limited to only IC products where replacement gate manufacturing processes are performed. That is, as will be appreciated by those skilled in the art after a complete reading of the present application, the methods and devices disclosed herein may involve the formation of the gate structures 106 using traditional gate-first manufacturing techniques.

Figure 5:
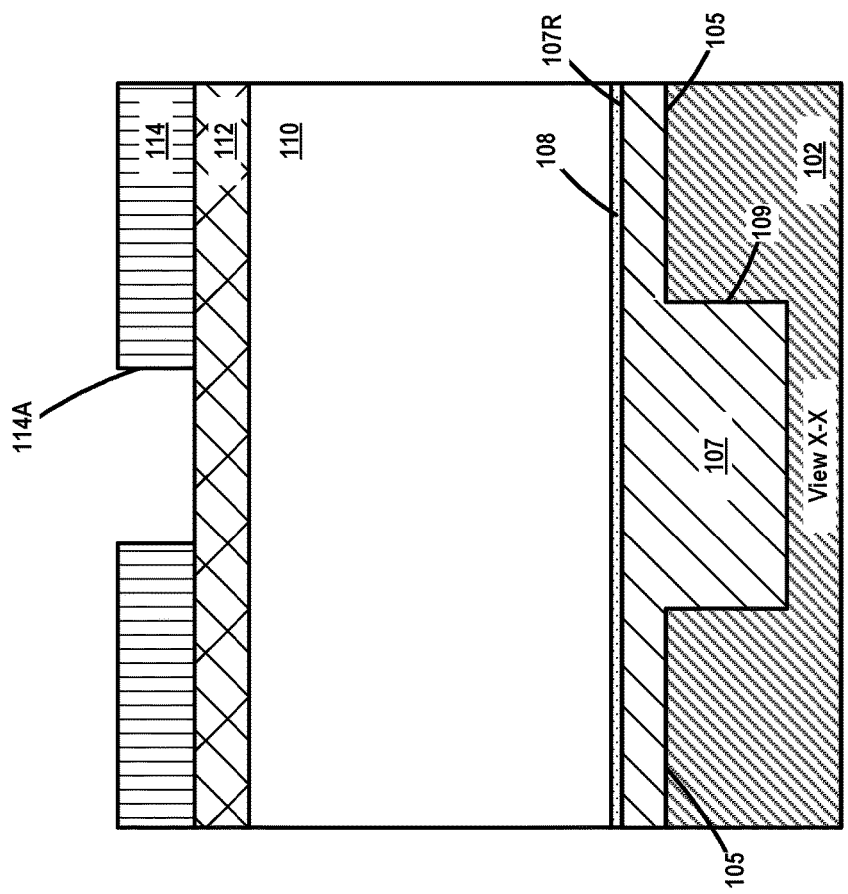
Figure 6:
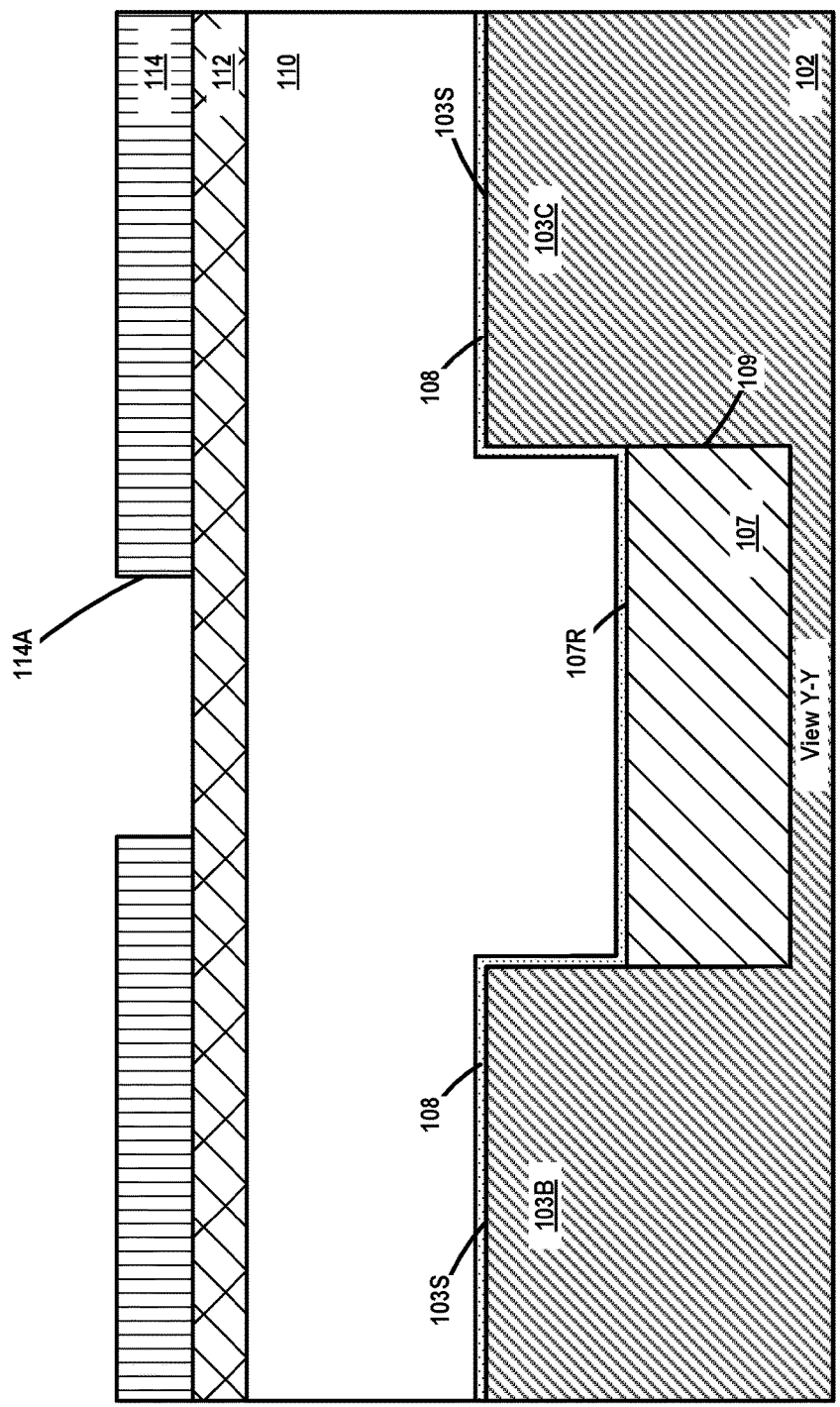
Figure 7:
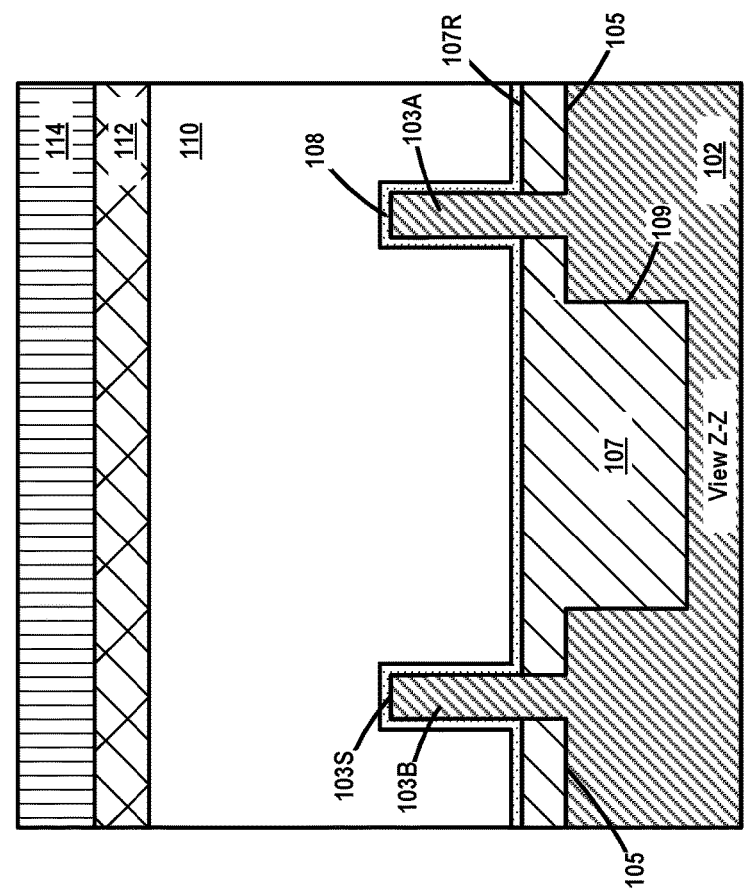

FIGS. 5, 6 and 7 depict the product after several process operations were performed. First, a layer of sacrificial gate electrode material 110 was formed on the product by performing a blanket deposition process. Thereafter, a layer of gate cap material 112 was deposited on the layer of sacrificial gate electrode material 110 by performing another blanket deposition process. Then, a patterned etch mask, e.g., a patterned OPL layer or a patterned layer of photoresist, was formed on the product 100. The patterned etch mask 114 comprises an illustrative opening 114A (see FIGS. 5 and 6) that is positioned at a location above the device isolation trenches 109 where the gate structure 5 will be formed. The opening 114A generally corresponds to the size and location of the illustrative elevated isolation structure 118X described more fully below. The patterned etch mask 114 is representative in nature in that it may be comprised of one or more layers of materials. The thickness and material of construction for the various layers of material shown in FIGS. 5-7 may vary depending upon the particular application. In one illustrative embodiment, the layer of sacrificial gate electrode material 110 may be comprised of a single layer of material, and it may be comprised of polysilicon, amorphous silicon, etc. The layer of gate cap material 112 may also be comprised of a variety of different materials, e.g., silicon nitride.

Figure 8:
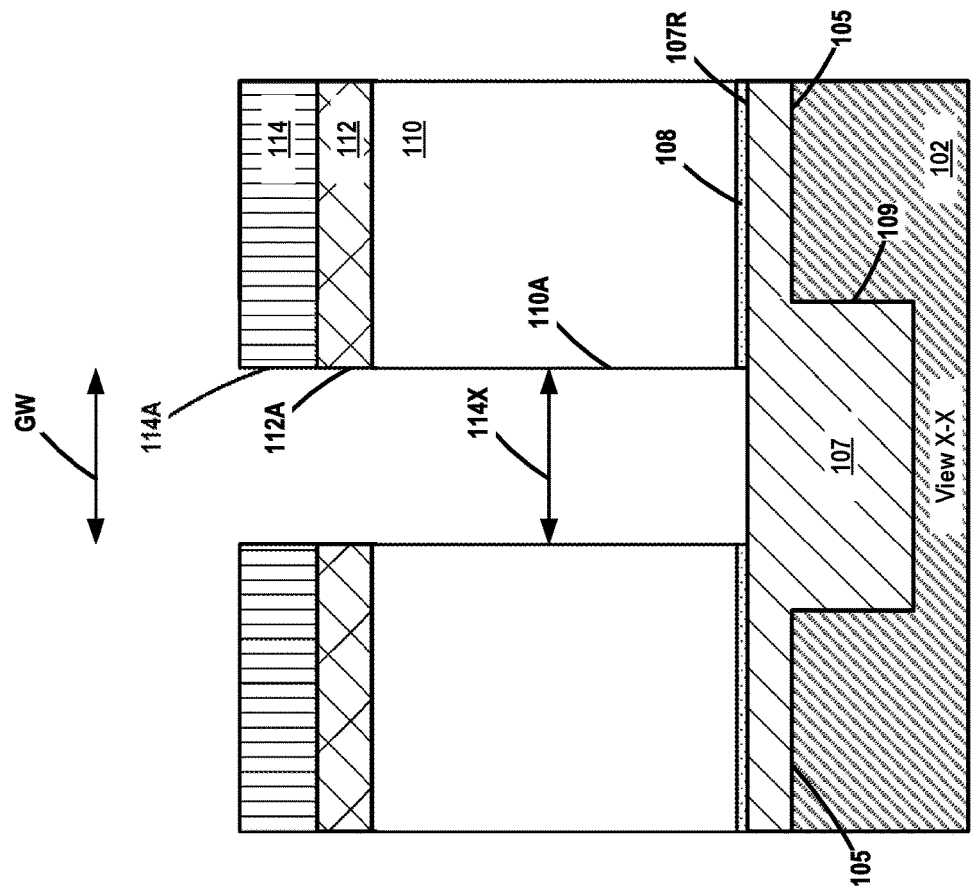
Figure 9:
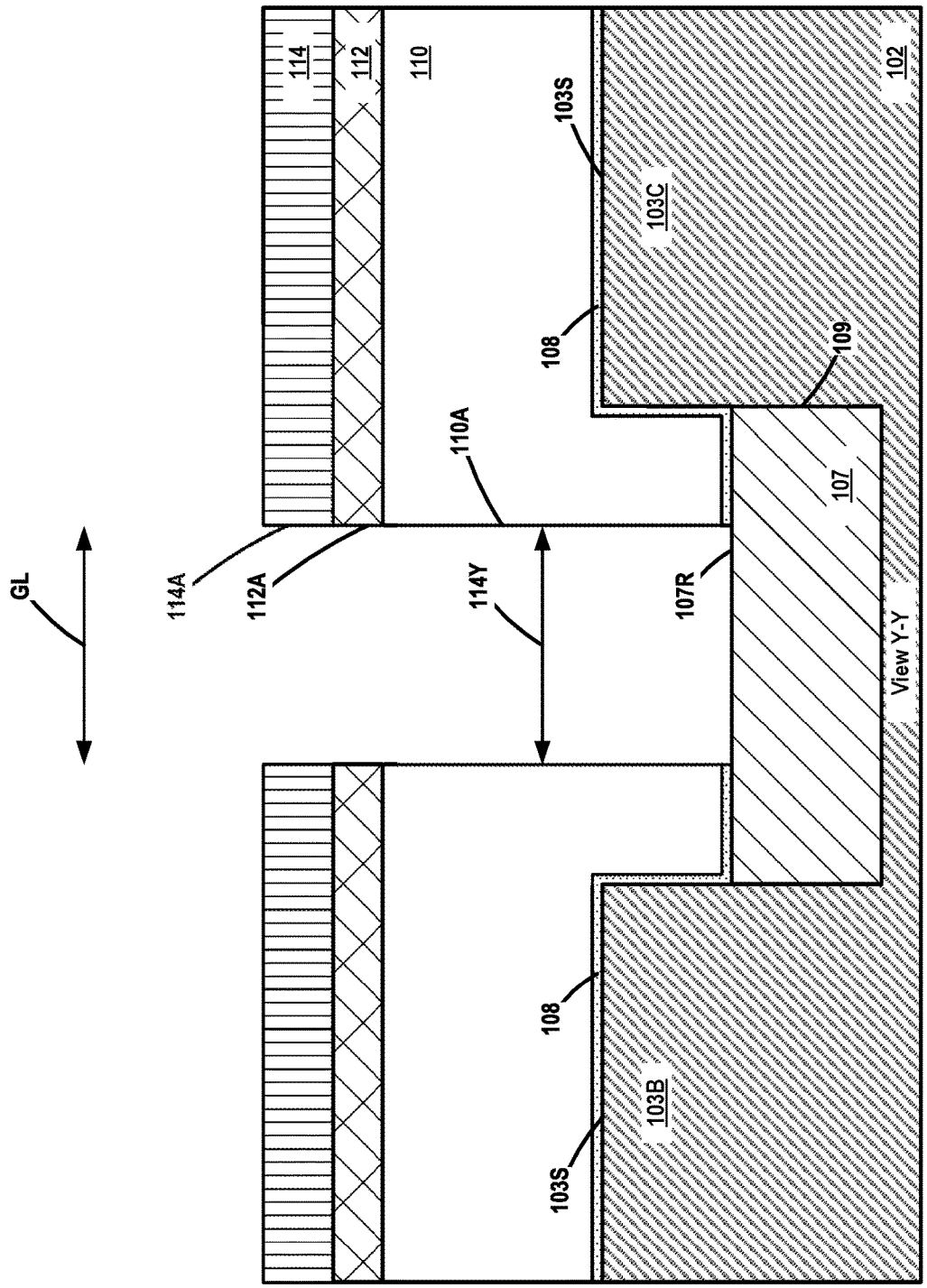

FIGS. 8 (view X-X) and 9 (view Y-Y) depict the product after several process operations were performed. More specifically, a first etching process, e.g., an anisotropic etching process, was performed through the opening 114A in the patterned etch mask 114 so as to form a corresponding opening 112A in the layer of gate cap material 112. The opening 112A exposes a portion of the layer of sacrificial gate electrode material 110. At that point, if desired, the patterned etch mask 114 may be removed. Thereafter, with or without the patterned etch mask 114 in position, another etching process, e.g., another anisotropic etching process, was performed so as to form an opening 110A in the layer of sacrificial gate electrode material 110. This latter etching process effectively stops on the isolation material 107 because the conformal sacrificial gate insulation layer 108 is very thin. The dimensions of the opening 110A may vary depending upon the particular application. For example, the opening 110A may have a first width 114X (see FIG. 8) in the gate width (GW) direction of the devices and a second width 114Y (see FIG. 9) in the gate length (GL) direction of the devices, wherein the second width 114Y is greater than the first width 114X. In other applications, the first and second widths 114X, 114Y may be substantially the same, or the first width 114X may be greater than the second width 114Y. Of course, the actual size or dimensions of the first and second widths 114X, 114Y may vary depending upon the particular application.

Figure 10:
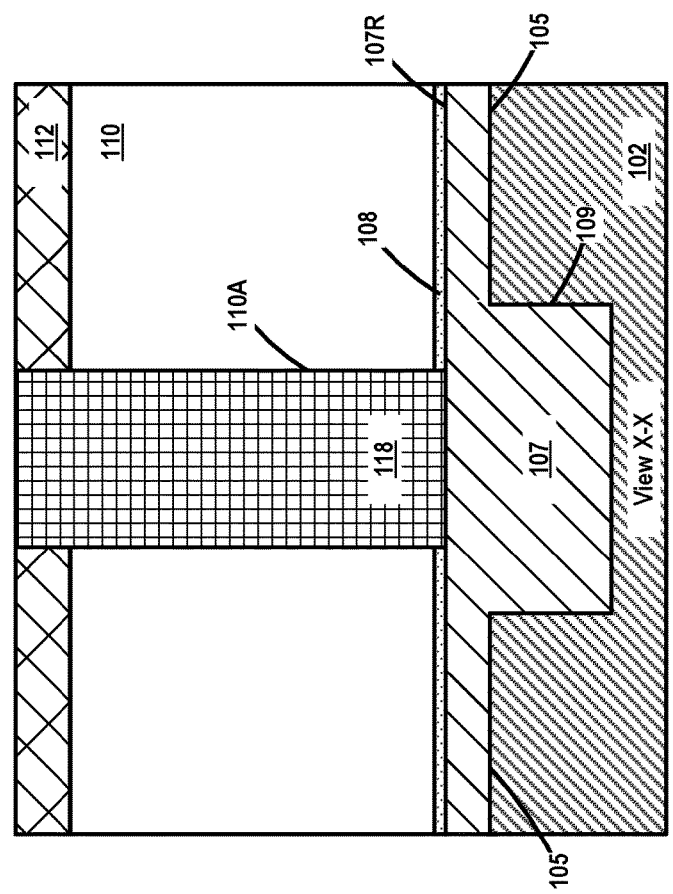
Figure 11:
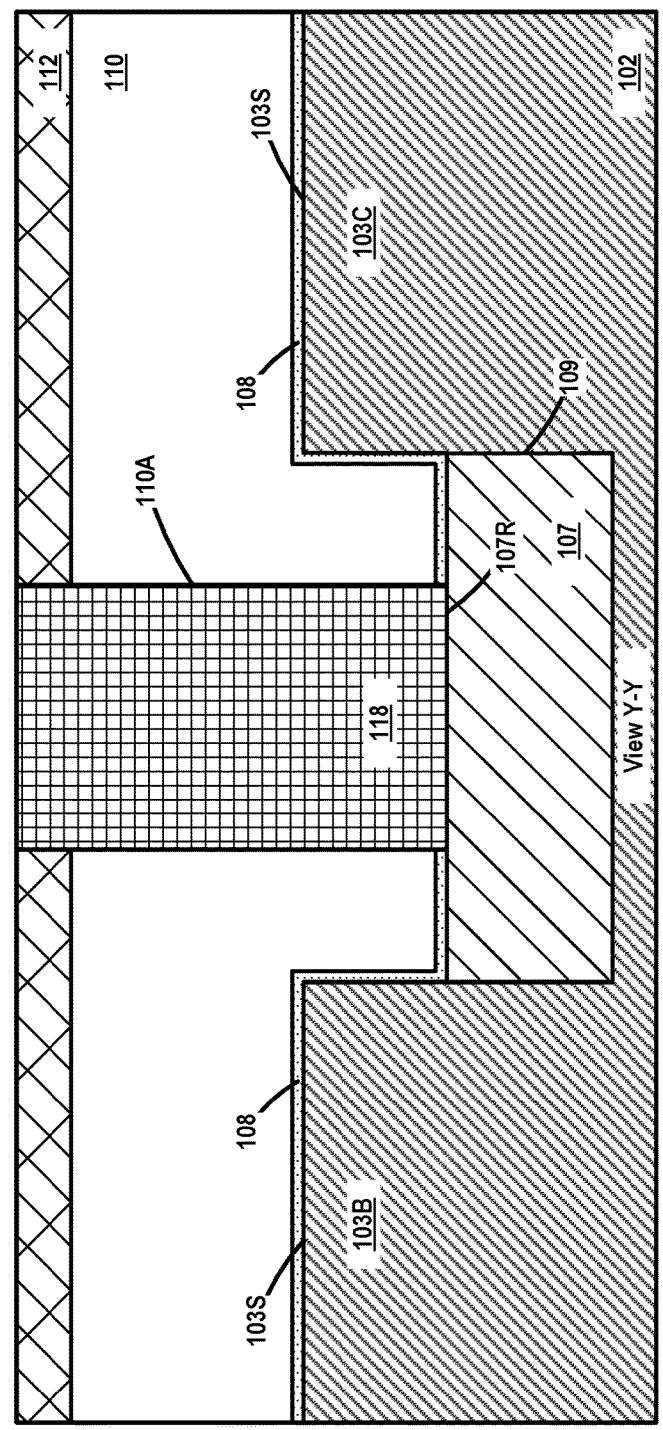

FIGS. 10 (view X-X) and 11 (view Y-Y) depict the product after several process operations were performed. First, if the patterned etch mask 114 has not been previously removed, it would now be removed. Then, a deposition process was performed to overfill the opening 110A with an insulating material 118, e.g., silicon nitride. Thereafter, one or more CMP process operations or etch-back process operations were performed that stopped on the upper surface of the layer of gate cap material 112. These process operations remove excess amounts of the insulating material 118 positioned above the layer of gate cap material 112.

Figure 12:
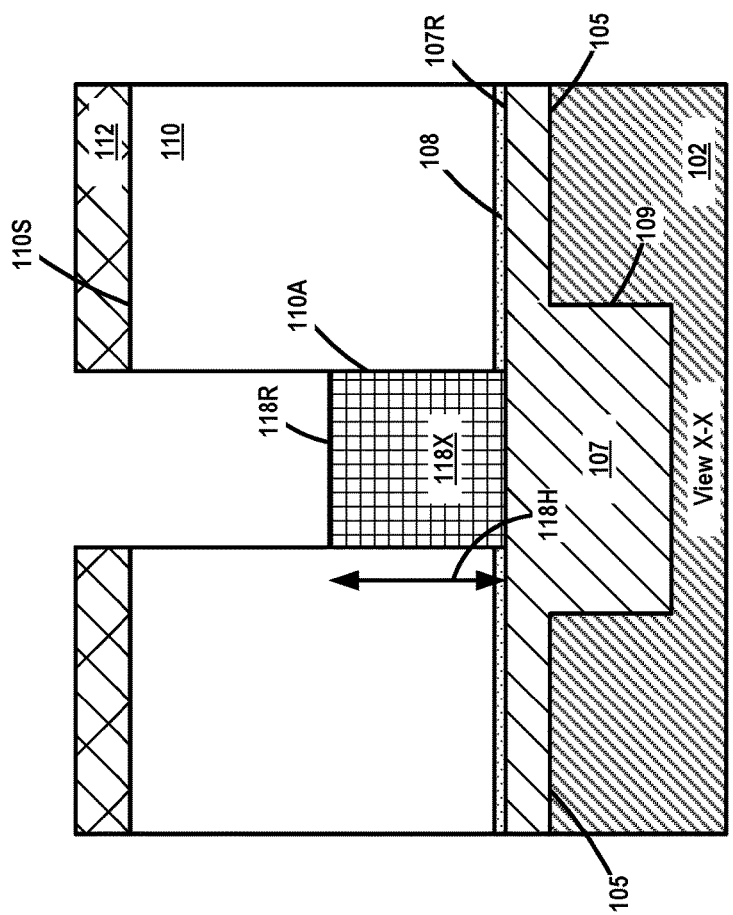
Figure 13:
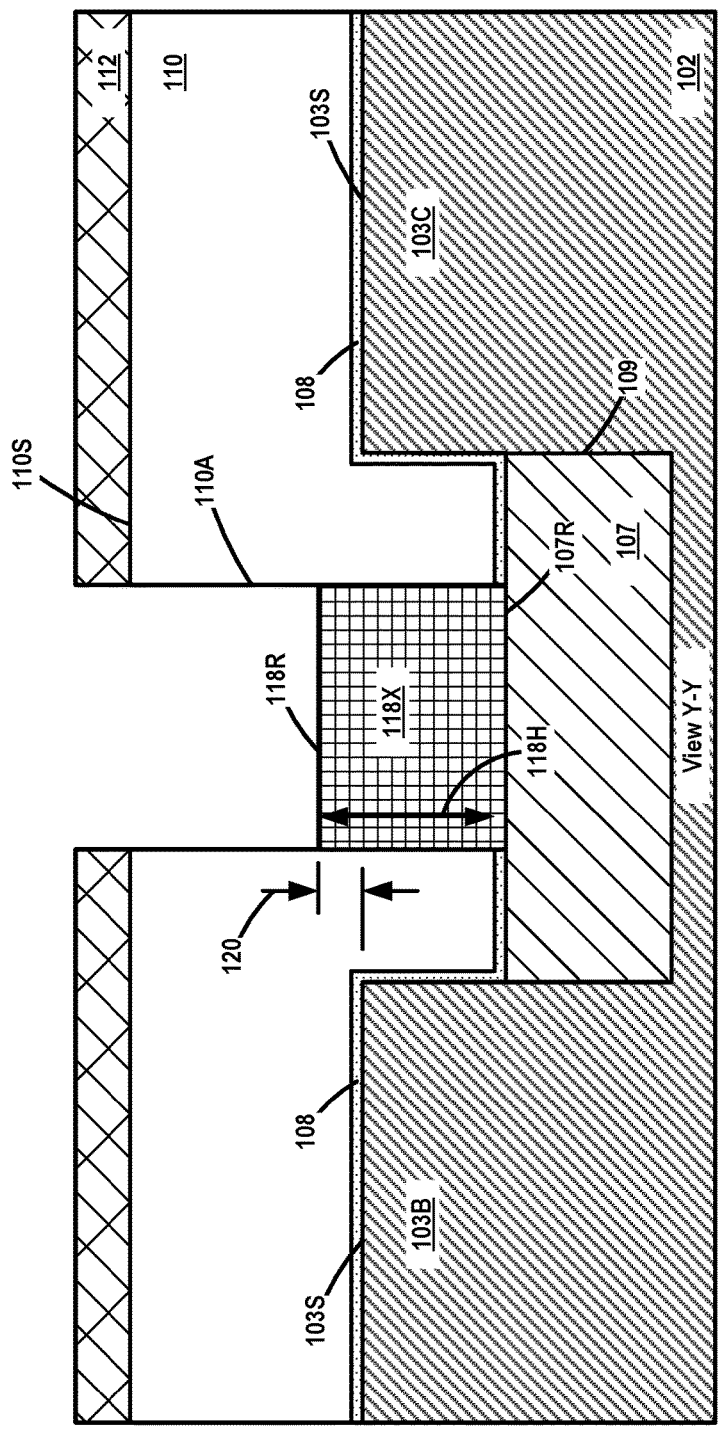

FIGS. 12 (view X-X) and 13 (view Y-Y) depict the product after a recess etching process was performed on the insulating material 118 so as to form an elevated isolation structure 118X in the opening 110A above the isolation material 107. The elevated isolation structure 118X has a recessed upper surface 118R. The amount of recessing of the insulating material 118 may vary depending upon the particular application. With reference to FIG. 13, in one illustrative embodiment, the recessing process is controlled such that the recessed upper surface 118R of the elevated isolation structure 118X is positioned at a level that is above a level of the upper surface 103S of the fins 103 and below a level of an upper surface 110S of the layer of sacrificial gate electrode material 110. In some applications, the distance 120 between the recessed upper surface 118R of the elevated isolation structure 118X and the upper surface 103S of the fins 103 may be about 5-10 nm. This relative spacing 120 can be useful to reduce the chances of an electrical short developing between the final gate structure 5 (at least a portion of which will be formed above the elevated isolation structure 118X) and any nearby fins 103. The overall height 118H of the elevated isolation structure 118X may also vary depending upon the particular application.

Figure 14:
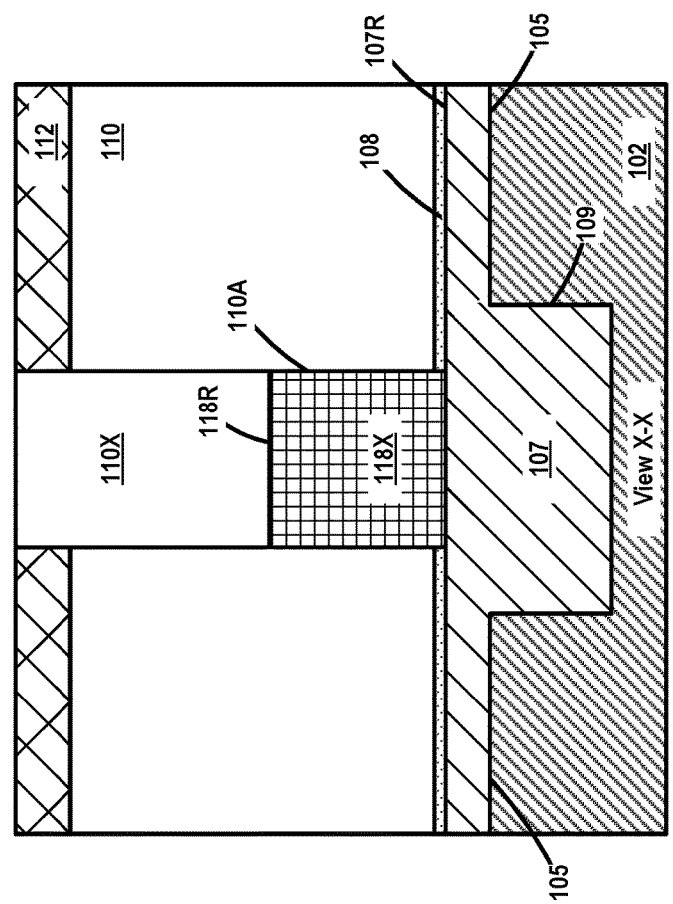

FIGS. 14 (view X-X) and 15 (view Y-Y) depict the product after several process operations were performed. First, a deposition process was performed to overfill the opening 110A with additional sacrificial gate electrode material, that is now designated with the reference number 110X. Typically, this additional material 110X may be the same as the sacrificial gate electrode material 110. Thereafter, one or more CMP process operations or etch-back process operations were performed that stopped on the upper surface of the layer of gate cap material 112. These process operations remove excess amounts of the additional sacrificial gate electrode material 110X. As depicted, the additional sacrificial gate electrode material 110X is positioned in the opening 110A above the elevated isolation structure 118X.

Figure 15:
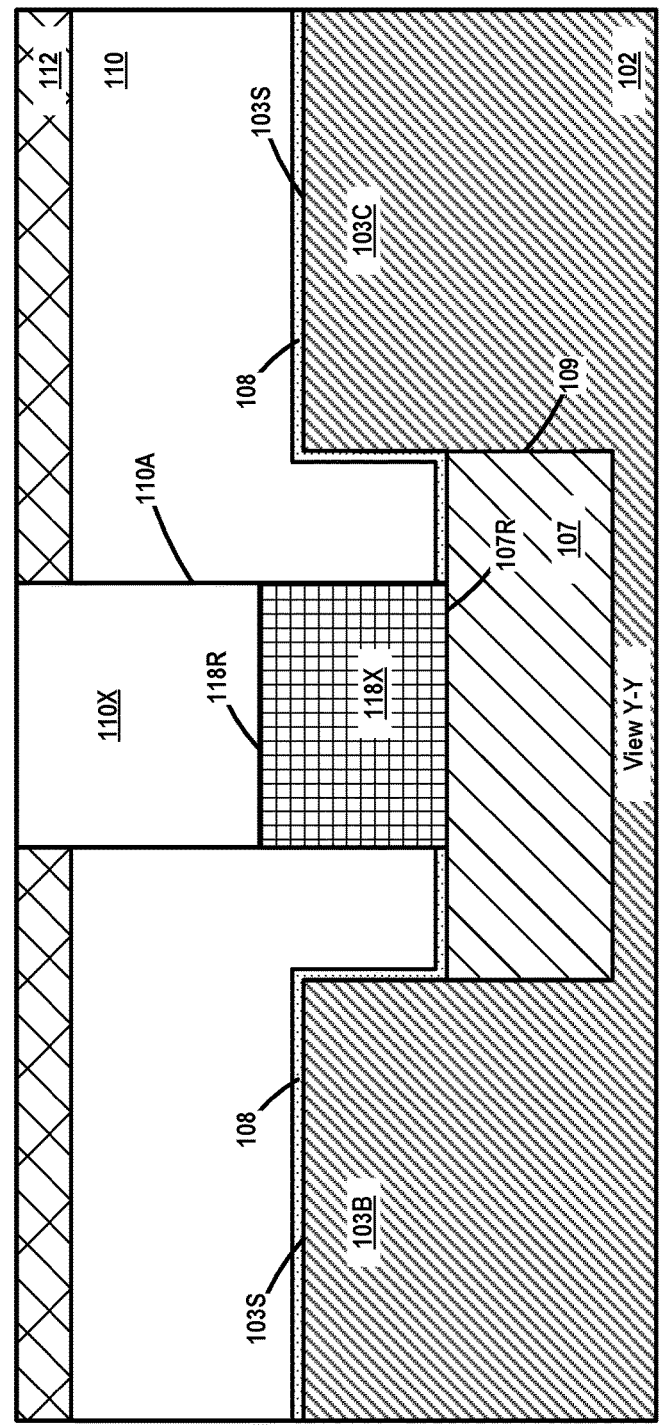
Figure 16:
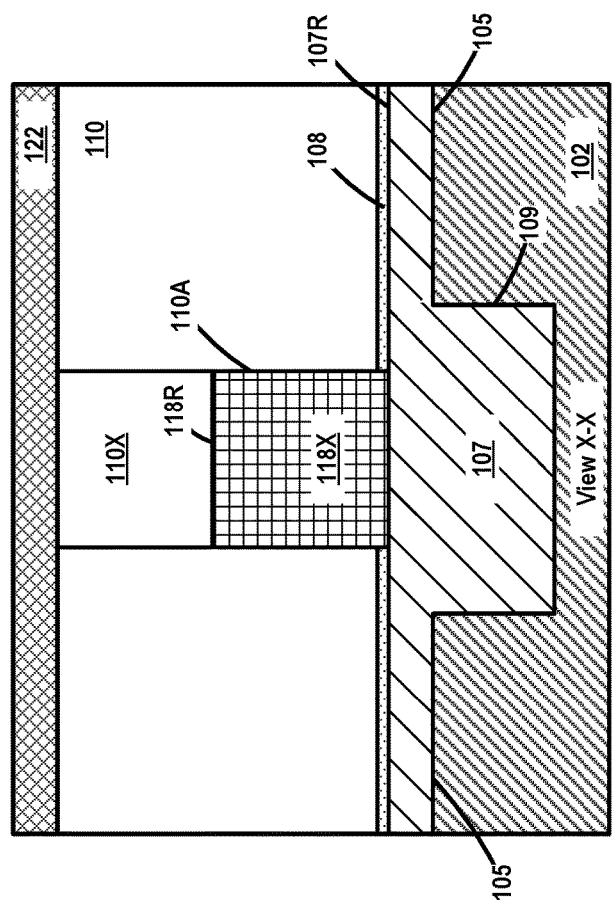
Figure 17:
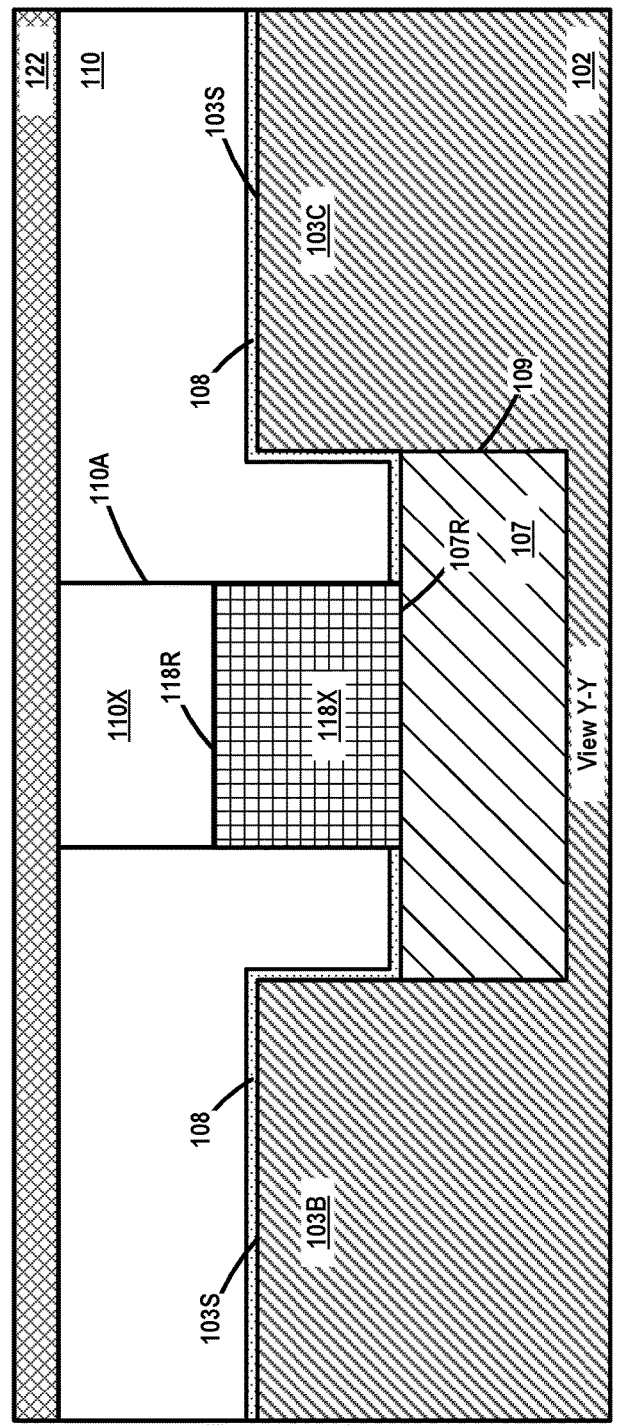

FIGS. 16 (view X-X) and 17 (view Y-Y) depict the product after several process operations were performed. In one illustrative process flow, the gate cap material 112 was removed. Then, additional sacrificial gate electrode material (not shown) was deposited above the product. Next, a CMP process was performed to planarize the upper surface of the sacrificial gate electrode material(s). Thereafter, a layer of sacrificial gate cap material 122, e.g., silicon nitride, was deposited above the product. In an alternative process flow (not shown in the drawings), the additional sacrificial gate electrode material 110X (see FIG. 15) may be recessed and additional gate cap material (not shown) may be formed above the existing gate cap material 112 and above the recessed additional sacrificial gate electrode material 110X. At that point, a CMP process may be performed to planarize the upper surface of the gate cap materials.

Figure 18:
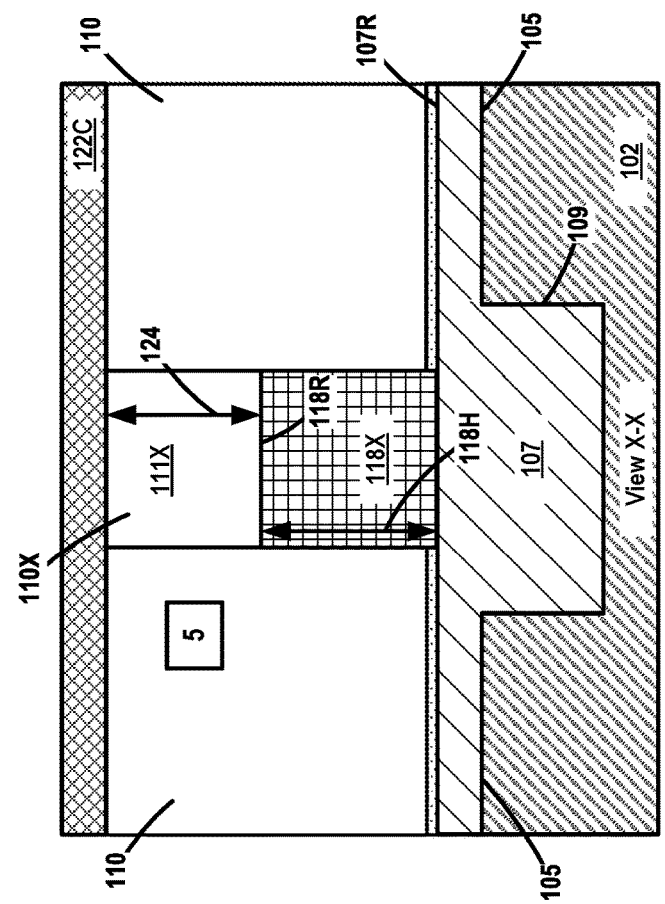
Figure 19:
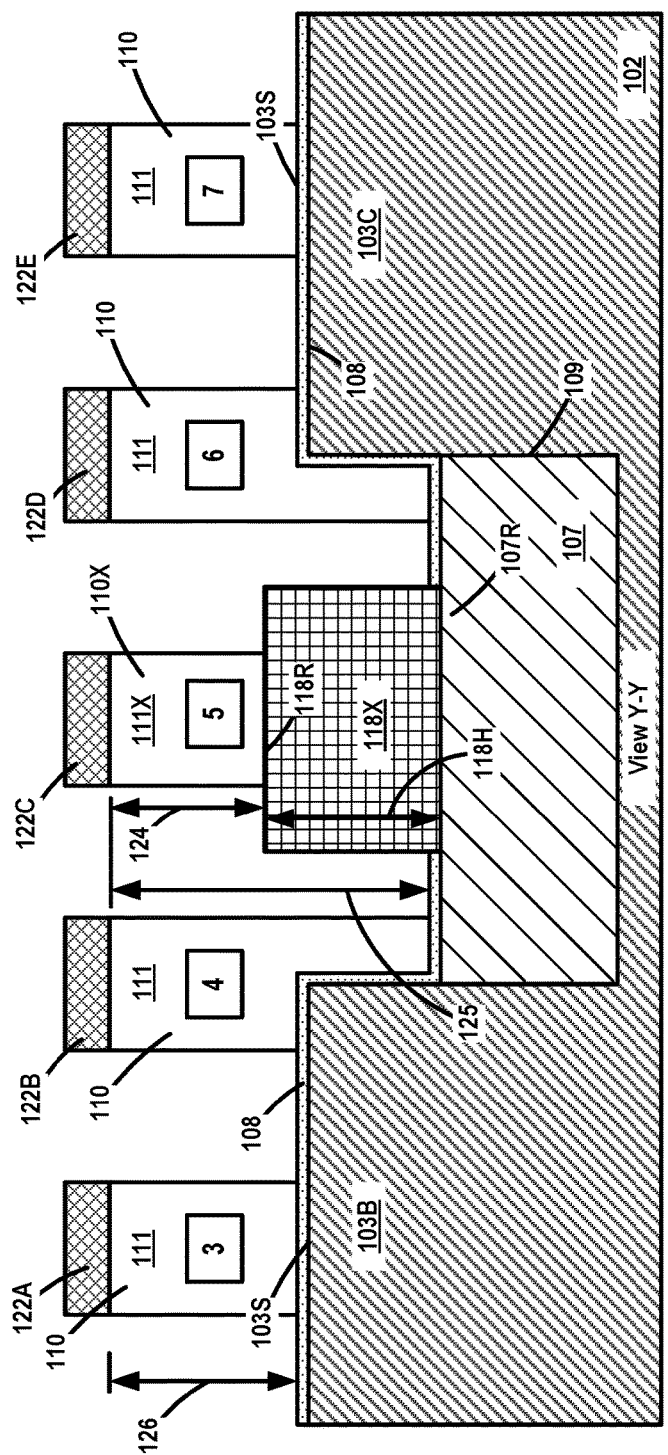

FIGS. 18 (view X-X) and 19 (view Y-Y) depict the product after several process operations were performed to form separate continuous line-type sacrificial gate electrode structures 111 across the substrate 102 for the gate structures 3-7 (the sacrificial gate electrode structure for gate 5 has been identified with the reference numeral 111X). This may be accomplished by forming a patterned photoresist etch mask (not shown) that is comprised of a plurality of line-type features above the layer of sacrificial gate cap material 122 and thereafter performing one or more etching processes through the patterned photoresist etch mask to remove the exposed portions of the layer of sacrificial gate cap material 122. This process operation results in the formation of separate sacrificial gate caps 122A-E (collectively referenced using the numeral 122) for each of the gate structures 3-7, respectively. At that point, the patterned photoresist etch mask may be removed and the gate caps 122A-E formed from the layer of sacrificial gate cap material 122 may serve as an etch mask to pattern sacrificial gate electrode materials 110, 110X. Note that at least a portion of the axial length of the sacrificial gate structure 111X for gate structure 5 is positioned above the elevated isolation structure 118X. Also note that, since the sacrificial gate structure 111X was formed above the sacrificial gate cap material 112, it has a significantly lesser height 124 as compared to the height 125 it would have had in the absence of the formation of the elevated isolation structure 118X. Accordingly, the portion of the sacrificial gate structure 111X positioned above the elevated isolation structure 118X has a significantly lower aspect ratio as compared to the similar gate structure (not shown) formed in the absence of the elevated isolation structure 118X. As a result, the sacrificial gate structure 111X is much less susceptible to undesirable tilting or overturning, thereby hopefully avoiding or at least reducing some of the problems such undesirable tilting or overturning can cause. With reference to FIG. 19, also note that the height 124 of the portion of the sacrificial gate structure 111X positioned above the elevated isolation structure 118X is less than the height 126 of the sacrificial gate structures 111 formed above the fins 103B and 103C.

Figure 20:
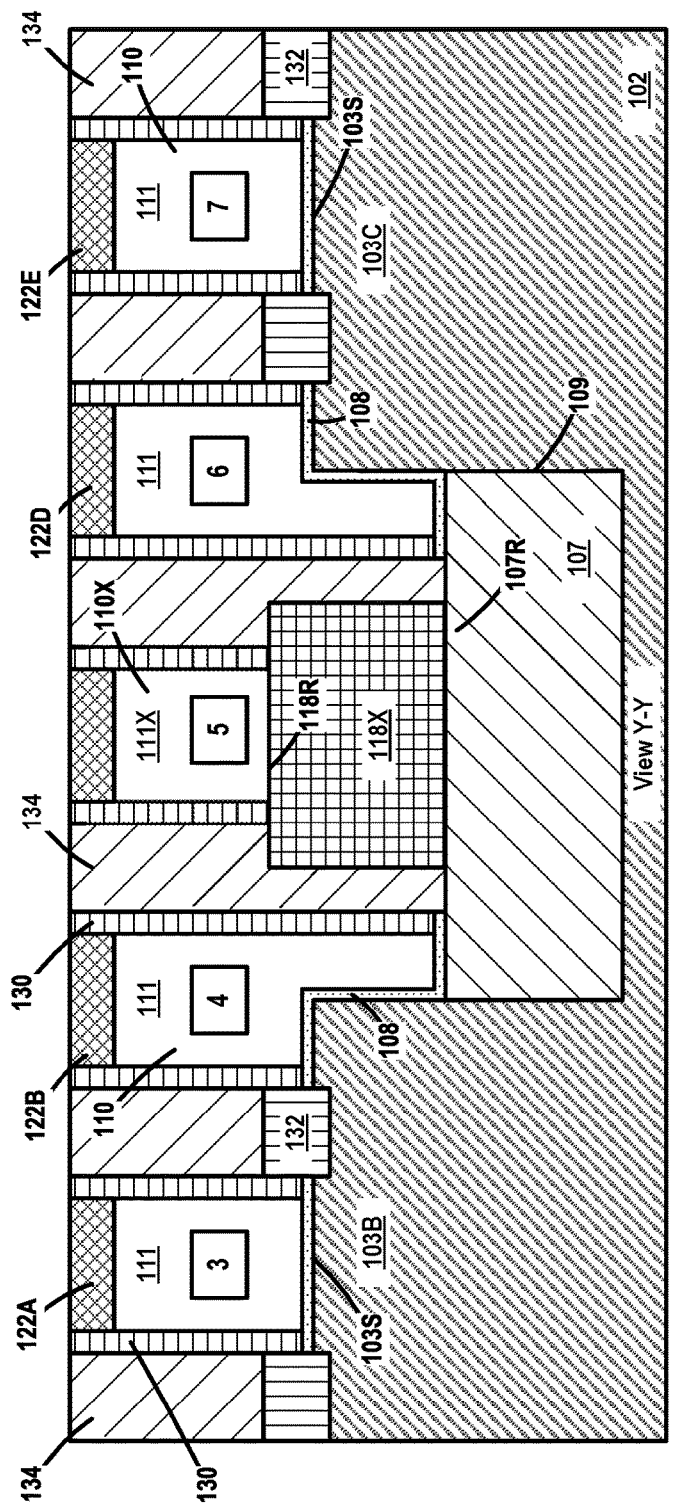

FIG. 20 depicts the product after several process operations were performed. First, a sidewall spacer 130 was formed adjacent the sidewalls of each of the continuous line-type sacrificial gate structures 111 by performing traditional spacer manufacturing techniques, i.e., depositing a conformal layer of spacer material and performing an anisotropic etching process. Next, epi semiconductor material 132 was formed on the exposed portions of the active regions (or fins 103 in the case of a FinFET device), i.e., in the source/drain regions of the devices, by performing an epitaxial growth process. The epi material 132 may be formed to any desired thickness. However, it should be understood that the epi material 132 need not be formed in all applications. Other layers of material, such as contact etch stop layers and the like, are not depicted in the drawings. Then, a layer of insulating material 134, e.g., silicon dioxide, was then deposited on the product 100 and a CMP process was performed to planarize the upper surface of the layer of insulating material 134 with the upper surface of the sacrificial gate caps 122A-E.

Figure 21:
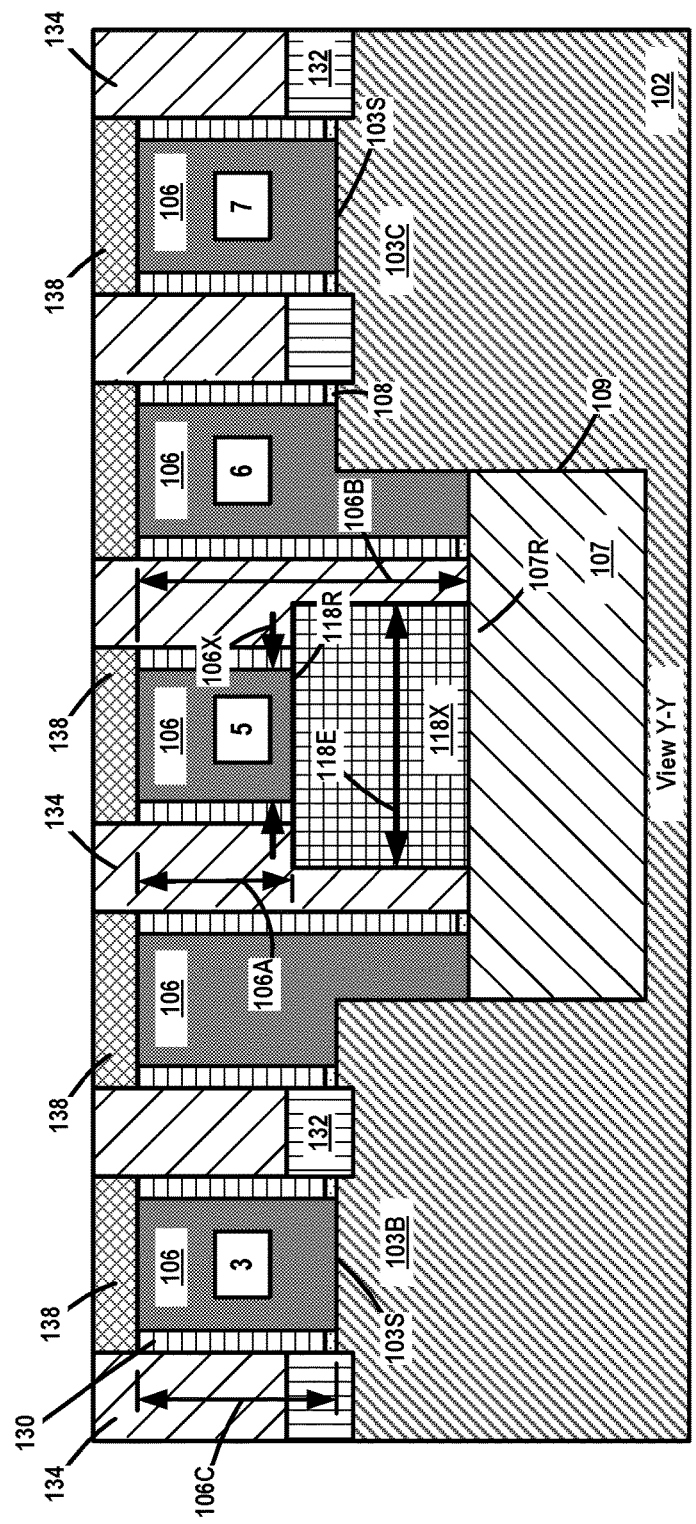

FIGS. 21 (view Y-Y) and 22 (view X-X) depict the product after several process operations were performed to form the final gate structures 106 for the transistor devices. First, at least one etching process was performed to remove the sacrificial gate caps 122 and portions of the sidewall spacers 130 so as to expose the upper surface of the sacrificial gate structures 111. Thereafter, another etching process was performed to remove exposed portions of the sacrificial gate structures 111 and perhaps portions of sacrificial gate insulation layer positioned under the sacrificial gate structures. This process operation defines a plurality of replacement gate cavities that are bounded by the remaining spacers 130. Next, various process operations were performed to form illustrative and simplistically depicted replacement or final gate structures 106 in each of the gate cavities. In one illustrative embodiment, the gate structures 106 may be comprised of one or more layers of insulating material that serve (in whole or part) as the gate insulation layer (not separately shown) of the gate structure 106 for the transistor devices, and one or more layers of conductive material, e.g., a metal, a metal alloy, polysilicon, a work-function adjusting metal, etc., that function (in whole or part) as the conductive gate electrode (not separately shown) of the gate structure 106 of the transistor devices. The thickness and composition of the materials for the gate structures 106 may vary depending upon the particular application. In one illustrative example, the same materials for the gate structure 106 may be used for the gate structures for both N- and P-type devices. In other applications, by formation of appropriate masking layers (not shown), the materials for the gate structures 106 used for N- and P-type devices may be different. In one illustrative embodiment, the layer of insulating material may be made of a high-k (k value of 10 or greater) insulating material, such as hafnium oxide, while the conductive gate electrode may be comprised of a metal or a metal-containing material such as titanium nitride that functions as a work-function adjusting layer, and a bulk layer of conductive material such as a metal, a metal alloy, tungsten or a doped polysilicon. As will be appreciated by those skilled in the art after a complete reading of the present application, the gate structure 106 is intended to be representative of any type of gate structure that may be formed using any manufacturing technique and any of a variety of different materials.

In one illustrative process flow, after formation of the materials for the gate structures 106, a CMP process may be performed to remove excess materials positioned above the layer of insulating material 134. At that point, one or more recess etching processes may be performed to remove portions of, or recess, the materials of the gate structures 106 within the gate cavities to make room for a final gate cap 138. The final gate cap 138 (e.g., silicon nitride) may be formed by depositing a layer of the gate cap material so as to overfill the gate cavities and thereafter performing a CMP process to remove excess materials.

Figure 22:
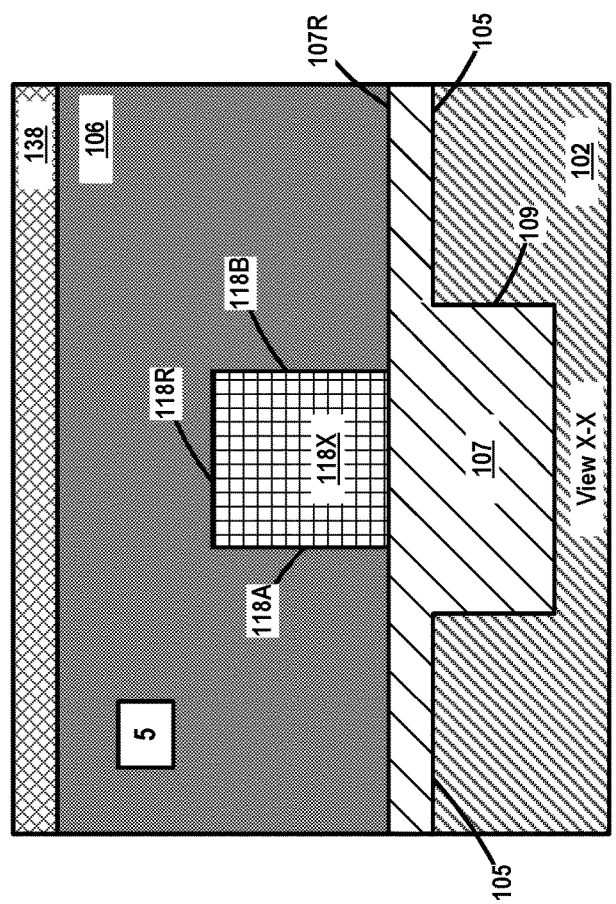

With respect to FIG. 21, note that, when viewed in a cross-section taken through the gate structure 106 for gate 5 in a direction corresponding to the gate length direction of the transistor devices, a portion of the gate structure 106 for gate 5 is positioned on top of and engages the upper surface 118R of the elevated isolation structure 118X. Also note that the elevated isolation structure 118X has lateral width 118E (in the gate length direction of the transistor devices) that is greater than the lateral width 106X (in the gate length direction of the transistor devices) of the gate structure 106 for gate 5. With continuing reference to FIG. 21, the portion of the gate structure 106 for gate 5 that is positioned above the elevated isolation structure 118X has a significantly lesser vertical height 106A as compared to the vertical height 106B it would have had in the absence of the formation of the elevated isolation structure 118X. Accordingly, the portion of the gate structure 106 for gate 5 that is positioned above the elevated isolation structure 118X has a significantly lower aspect ratio as compared to the similar gate structure (not shown) formed in the absence of the elevated isolation structure 118X. Aa a result, the gate structure 106 for gate 5 is much less susceptible to undesirable tilting or overturning, thereby hopefully avoiding or at least reducing some of the problems such undesirable tilting or overturning can cause. With reference to FIG. 21, also note that the vertical height 106A of the portion of the gate structure 106 for gate 5 that is positioned above the elevated isolation structure 118X is less than the vertical height 106C of the gate structures 106 formed above the fins 103B and 103C. With reference to FIG. 22, note that, when viewed in a cross-section taken through the gate structure 106 for gate 5 in a direction corresponding to the gate width direction of the transistor devices, the gate structure 106 for gate 5 wraps around the elevated isolation structure 118X. More specifically, the gate structure 106 for gate 5 engages the upper surface 118R as well as the side surfaces 118A, 118B of the elevated isolation structure 118X.

Figure 23:
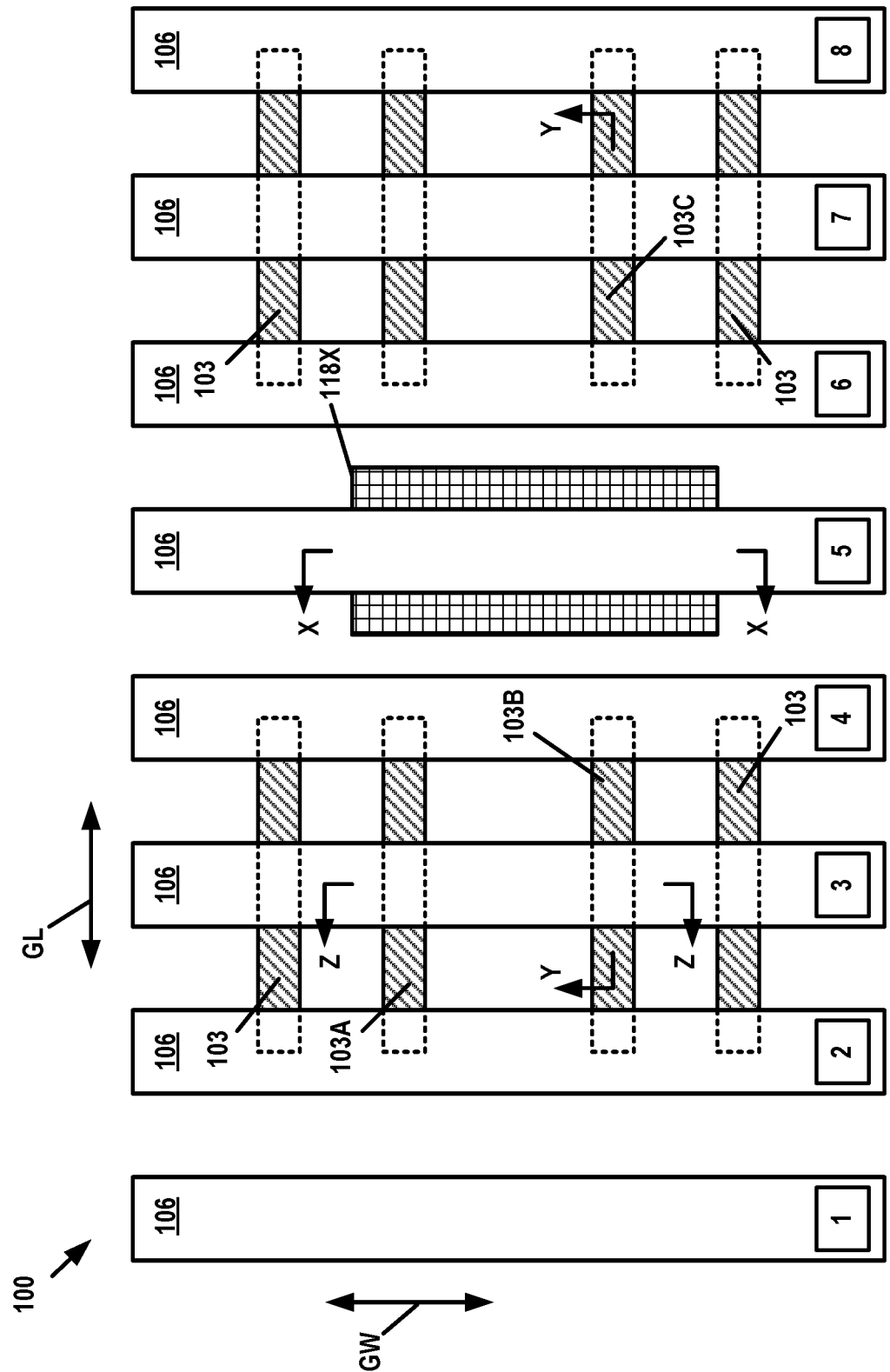

FIG. 23 is a simplistic plan view showing the position of the illustrative elevated isolation structure 118X under a portion of the axial length of the gate structure 106 of gate 5.

Figure 24:
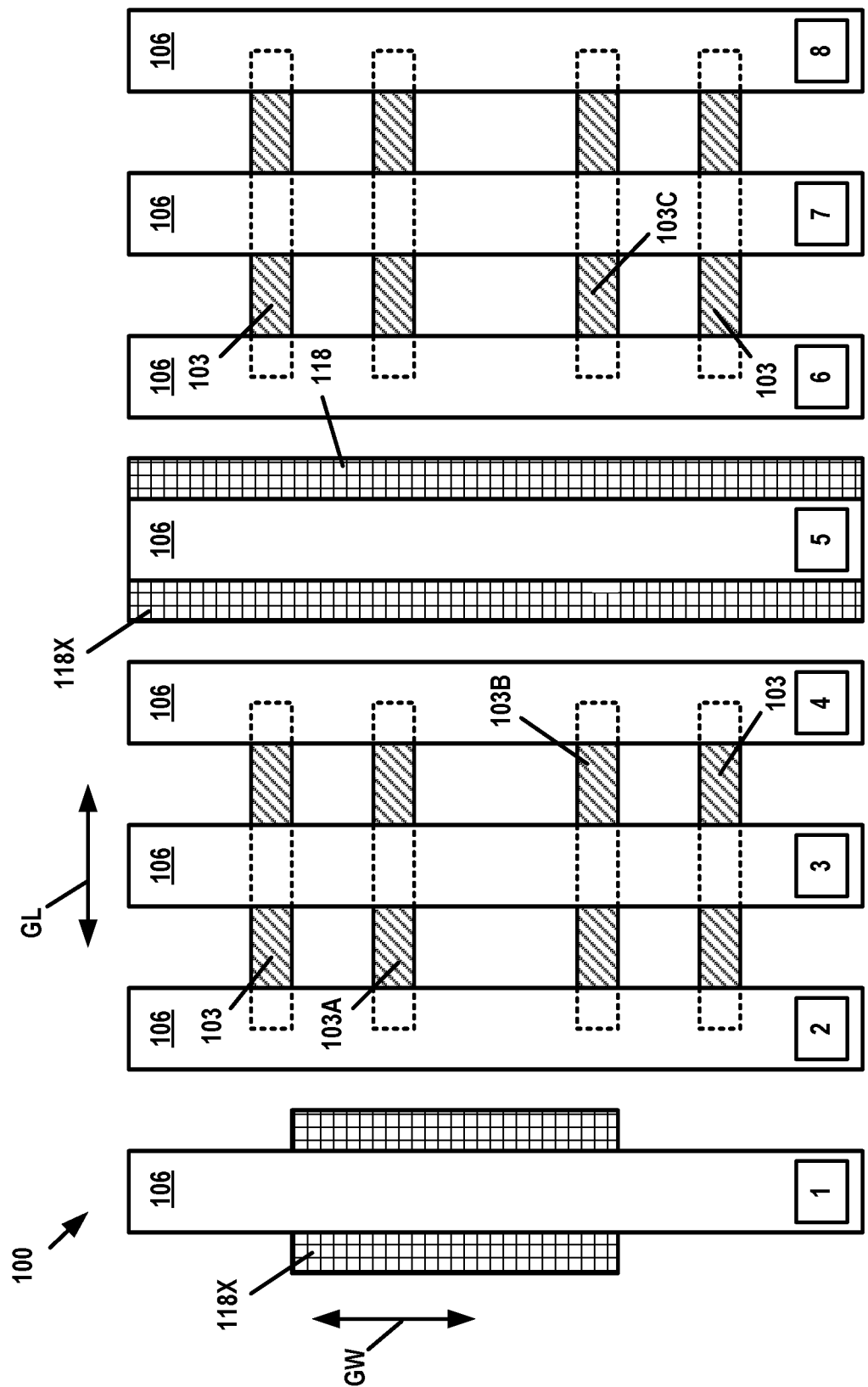

Of course, as will be appreciated by those skilled in the art after a complete reading of the present application, the elevated isolation structures 118X disclosed herein may be formed to any desired length and at any desired location on the IC product. For example, FIG. 24 is a simplistic plan view that depicts an embodiment wherein an illustrative elevated isolation structure 118X was positioned under a substantial portion of or substantially all of the axial length of the gate structure 106 of gate 5. FIG. 24 also depicts another illustrative elevated isolation structure 118X that is positioned under only a portion of the axial length of the gate structure 106 of gate 1.

Figure 25:
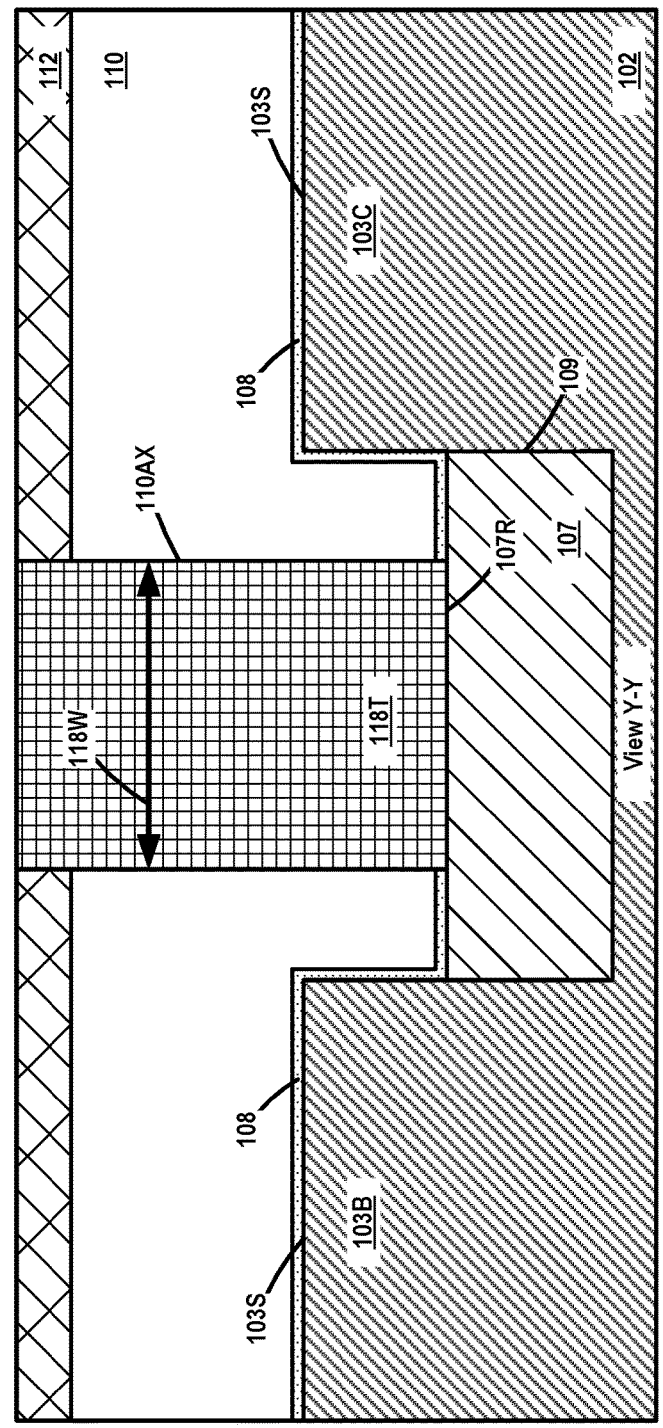
Figure 26:
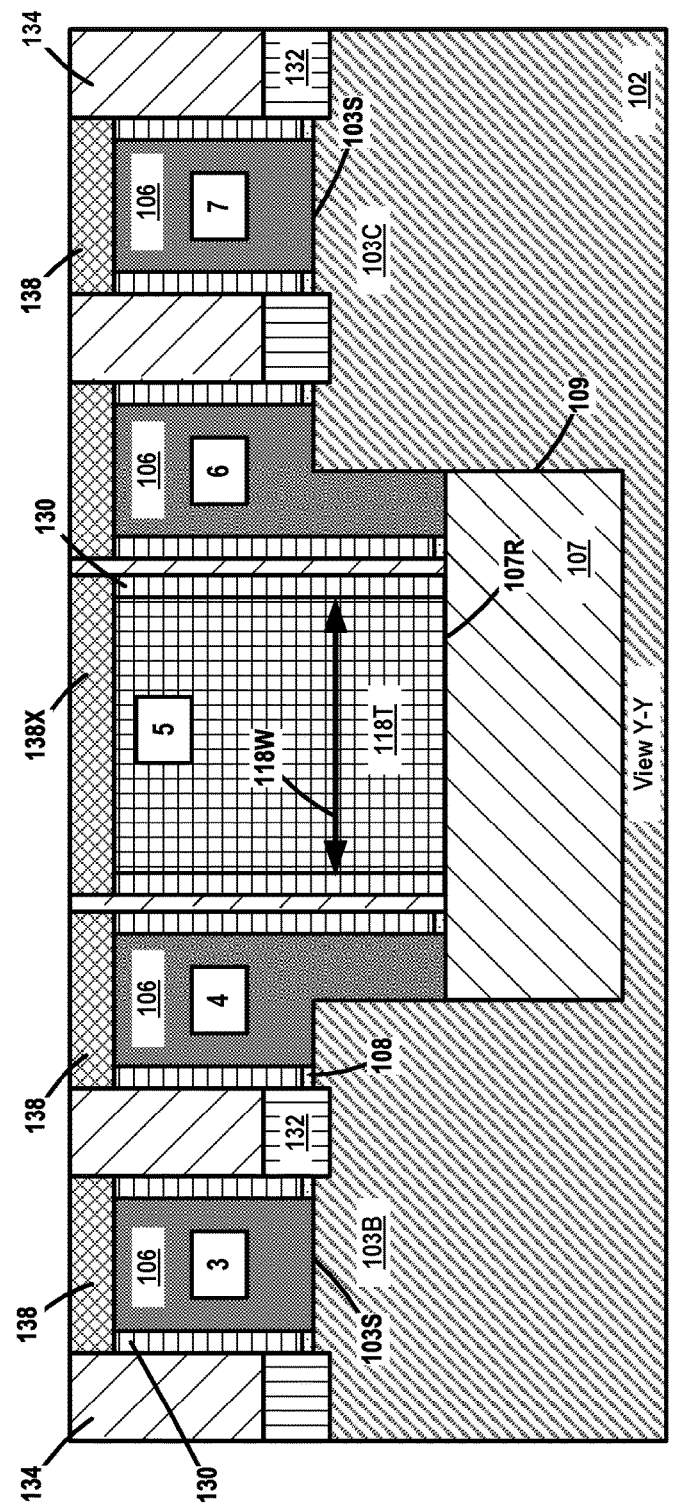
Figure 27:
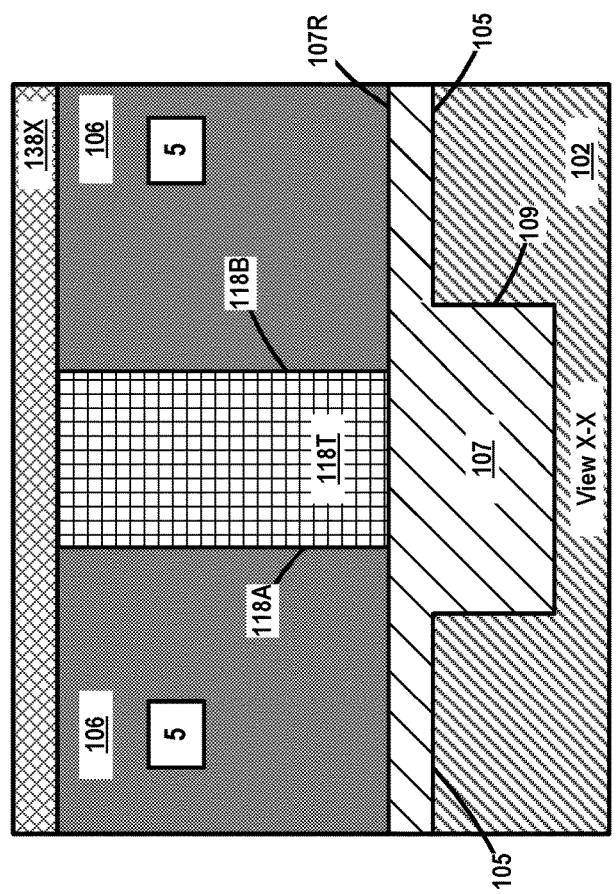

FIGS. 25 (view Y-Y), 26 (view Y-Y), and 27 (view X-X) depict another illustrative process flow and elevated isolation structure disclosed herein. With reference to FIG. 25, in this illustrative embodiment, the sacrificial gate electrode materials 110 were patterned so as to have an opening 110AX that, in the gate length direction of the devices, is greater in size than the previously described opening 110A. That is, in this embodiment, the elevated isolation structure 118T has a width 118W (in the gate length direction of the devices) that is greater than the corresponding width of the previously described elevated isolation structure 118X. Additionally, in this embodiment, after the elevated isolation structure 118T was initially formed, it was not recessed as was the case above (see FIGS. 12 and 13). FIGS. 26 and 27 depict the product after the formation of the above-described gate structures 106. Note that the drawings are not to scale. As best seen in FIG. 27, in this embodiment, the elevated isolation structure 118T is effectively a dielectric plug that separates the conductive gate structures on opposite sides of the elevated isolation structure 118T. More specifically, one portion of the gate structure 106 is positioned adjacent the side 118A of the elevated isolation structure 118T, while another portion of the gate structure 106 is positioned adjacent the opposite side 118B of the elevated isolation structure 118T. Also note that, in this embodiment, the gate structure 106 for gate 5 is not positioned above the upper surface of the elevated isolation structure 118T.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:
1. An integrated circuit product, comprising:
   a plurality of FinFET transistor devices, each of said FinFET transistor devices having a gate width direction and a gate length direction;
   a plurality of fins, each of said plurality of fins having a first upper surface that is positioned at a first level;
   an elevated isolation structure having first and second opposing side surfaces and a second upper surface that is positioned at a second level that is above said first level of said first upper surface of each of said plurality of fins; and a first gate structure having an axial length in a direction corresponding to said gate width direction of said transistor devices, wherein a portion of said axial length of said first gate structure is positioned above said second upper surface of said elevated isolation structure, and wherein, when viewed in a cross-section taken in a direction corresponding to said gate width direction of said transistor devices, said first gate structure physically engages said second upper surface and physically engages said first and second opposing side surfaces of said elevated isolation structure.

2. The integrated circuit product of claim 1, wherein said at least a portion of said axial length of said first gate structure has a bottom surface that has a first lateral width in a direction corresponding to said gate length direction of said transistor devices and said elevated isolation structure has a second lateral width in a direction corresponding to said gate length direction of said transistor devices, said first lateral width being less than said second lateral width.

3. The integrated circuit product of claim 1, wherein, when viewed in a cross-section taken in a direction corresponding to said gate length direction of said transistor devices and through at least two fins, at least a portion of said elevated isolation structure is positioned in a space between said at least two fins.

4. The integrated circuit product of claim 1, wherein said elevated isolation structure is positioned above isolation material positioned in a trench formed in a semiconductor substrate.

5. The integrated circuit product of claim 1, wherein said second level of said second upper surface of said elevated isolation structure is positioned at least 5 nm above said first level of said first upper surface of each of said plurality of fins.

6. The integrated circuit product of claim 1, further comprising a second gate structure, at least a portion of said second gate structure being positioned above said first upper surface of a first fin of one of said plurality of fins, wherein said at least a portion of said first gate structure that is positioned above said elevated isolation structure has a first vertical height, and wherein said at least a portion of said second gate structure that is positioned above said first upper surface of said first fin has a second vertical height, said first vertical height being less than said second vertical height.

7. An integrated circuit product, comprising:
a plurality of FinFET transistor devices, each of said FinFET transistor devices having a gate width direction and a gate length direction;
a plurality of fins, each of said plurality of fins having a first upper surface that is positioned at a first level;
a trench formed in a semiconductor substrate, said trench having isolation material positioned in said trench;
an elevated isolation structure positioned above said isolation material in said trench, wherein said elevated isolation structure has first and second opposing side surfaces and a second upper surface that is positioned at a second level that is above said first level of said first upper surface of each of said plurality of fins and a first lateral width in a direction corresponding to said gate length direction of said transistor devices; and
a first gate structure having an axial length in a direction corresponding to said gate width direction of said transistor devices, wherein a portion of said axial length of said first gate structure is positioned above said second upper surface of said elevated isolation structure, wherein, when viewed in a cross-section taken in a direction corresponding to said gate width direction of said transistor devices, said first gate structure physically engages said second upper surface and physically engages said first and second opposing side surfaces of said elevated isolation structure, and wherein said portion of said axial length of said first gate structure has a bottom surface that has a second lateral width in a direction corresponding to said gate length direction of said transistor devices, said first lateral width being greater than said second lateral width.

8. The integrated circuit product of claim 7, wherein, when viewed in a cross-section taken in a direction corresponding to said gate length direction of said transistor devices and through at least two fins, at least a portion of said elevated isolation structure is positioned in a space between said at least two fins.

9. The integrated circuit product of claim 7, further comprising a second gate structure, at least a portion of said second gate structure being positioned above said first upper surface of a first fin of one of said plurality of fins, wherein said at least a portion of said first gate structure that is positioned above said elevated isolation structure has a first vertical height, and wherein said at least a portion of said second gate structure that is positioned above said first upper surface of said first fin has a second vertical height, said first vertical height being less than said second vertical height.

10. The integrated circuit product of claim 9, wherein an upper surface of said first gate structure is positioned at substantially a same level as an upper surface of said second gate structure.

11. The integrated circuit product of claim 7, wherein said second level of said second upper surface of said elevated isolation structure is positioned at least 5 nm above said first level of said first upper surface of each of said plurality of fins.

12. The integrated circuit product of claim 7, wherein said isolation material laterally surrounds a portion of each of said plurality of fins and has a third upper surface that is positioned at a third level that is below said first level of said first upper surface of each of said plurality of fins.

13. The integrated circuit product of claim 7, wherein said first gate structure is a replacement gate structure comprising a gate insulation layer and a conductive gate electrode, said gate insulation layer comprising a high-k insulating material and said conductive gate electrode comprising at least one work-function adjusting layer and a layer of conductive material.

14. The integrated circuit product of claim 1, wherein said first gate structure is a replacement gate structure comprising a gate insulation layer and a conductive gate electrode, said gate insulation layer comprising a high-k insulating material and said conductive gate electrode comprising at least one work-function adjusting layer and a layer of conductive material.

15. The integrated circuit product of claim 4, wherein said isolation material laterally surrounds a portion of each of said plurality of fins and has a third upper surface that is positioned at a third level that is below said first level of said first upper surface of each of said plurality of fins.

16. The integrated circuit product of claim 6, wherein an upper surface of said first gate structure is positioned at substantially a same level as an upper surface of said second gate structure.

17. An integrated circuit product, comprising:
a plurality of FinFET transistor devices, each of said FinFET transistor devices having a gate width direction and a gate length direction;

first and second fins, each of said first and second fins having a first upper surface that is positioned at a first level;

a trench formed in a semiconductor substrate, wherein said trench is positioned between said first and second fins;

isolation material positioned in said trench and laterally surrounding each of said first and second fins, said isolation material having a second upper surface that is positioned at a second level that is below said first level of said first upper surface of each of said first and second fins;

an elevated isolation structure positioned above said second upper surface of said isolation material, wherein said elevated isolation structure has first and second opposing side surfaces and a third upper surface that is positioned at a third level that is above said first level of said first upper surface of each of said first and second fins;

a first gate structure having an axial length in a direction corresponding to said gate width direction of said transistor devices and a fourth upper surface that is positioned at a fourth level, wherein a portion of said axial length of said first gate structure is positioned above said third upper surface of said elevated isolation structure, and wherein, when viewed in a cross-section taken in a direction corresponding to said gate width direction of said transistor devices, said first gate structure engages said third upper surface and said first and second opposing side surfaces of said elevated isolation structure; and a second gate structure that is at least partially positioned above said first upper surface of one of said first and second fins, said second gate structure having a fifth upper surface that is positioned at a fifth level that is substantially the same as said fourth level of said fourth upper surface of said first gate structure.

* * * * *